(12) United States Patent
Emerson et al.

(10) Patent No.: US 7,611,917 B2
(45) Date of Patent: Nov. 3, 2009

(54) METHODS OF FORMING LIGHT EMITTING DEVICES WITH ACTIVE LAYERS THAT EXTEND INTO OPENED PITS

(75) Inventors: David Todd Emerson, Durham, NC (US); Michael John Bergmann, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/243,507

(22) Filed: Oct. 1, 2008

(65) Prior Publication Data

US 2009/0029493 A1 Jan. 29, 2009

Related U.S. Application Data

(62) Division of application No. 11/118,987, filed on Apr. 29, 2005, now Pat. No. 7,446,345.

(51) Int. Cl.
*H01L 21/00* (2006.01)
(52) U.S. Cl. .............................. 438/42; 438/29; 438/46
(58) Field of Classification Search ................... 438/29, 438/31, 32, 36, 37, 42, 43, 44, 46, 47
See application file for complete search history.

(56) References Cited

U.S. PATENT DOCUMENTS

| | | | |
|---|---|---|---|
| 5,393,993 A | | 2/1995 | Edmond et al. |
| 5,523,589 A | | 6/1996 | Edmond et al. |
| 6,015,979 A | * | 1/2000 | Sugiura et al. ................ 257/86 |
| 6,121,634 A | | 9/2000 | Saito et al. |
| 6,201,262 B1 | | 3/2001 | Edmond et al. |
| 6,329,667 B1 | * | 12/2001 | Ota et al. ....................... 257/13 |
| 6,459,100 B1 | | 10/2002 | Doverspike et al. |
| 6,586,327 B2 | * | 7/2003 | Shepard ......................... 438/43 |
| 6,664,560 B2 | | 12/2003 | Emerson et al. |

(Continued)

FOREIGN PATENT DOCUMENTS

WO WO 2004/057680 A1 7/2004

OTHER PUBLICATIONS

U.S. Appl. No. 10/811,350 entitled "Etching of Substrates of Light Emitting Devices" filed Mar. 26, 2004.

(Continued)

*Primary Examiner*—Kevin M Picardat
(74) *Attorney, Agent, or Firm*—Myers Bigel Sibley & Sajovec

(57) ABSTRACT

Light emitting devices include an active region comprising a plurality of layers and a pit opening region on which the active region is disposed. The pit opening region is configured to expand a size of openings of a plurality of pits to a size sufficient for the plurality of layers of the active region to extend into the pits. In some embodiments, the active region comprises a plurality of quantum wells. The pit opening region may comprise a superlattice structure. The pits may surround their corresponding dislocations and the plurality of layers may extend to the respective dislocations. At least one of the pits of the plurality of pits may originate in a layer disposed between the pit opening layer and a substrate on which the pit opening layer is provided. The active region may be a Group III nitride based active region. Methods of fabricating such devices are also provided.

29 Claims, 5 Drawing Sheets

U.S. PATENT DOCUMENTS

| | | | |
|---|---|---|---|
| 6,667,184 B2 * | 12/2003 | Motoki et al. | 438/22 |
| 6,693,303 B2 | 2/2004 | Ota et al. | |
| 6,734,003 B2 | 5/2004 | Loughney | |
| 6,740,906 B2 | 5/2004 | Slater | |
| 7,037,741 B2 * | 5/2006 | Tasi et al. | 438/38 |
| 2001/0021572 A1 * | 9/2001 | Orita et al. | 438/46 |
| 2002/0084452 A1 | 7/2002 | Ota et al. | |
| 2003/0001161 A1 | 1/2003 | Ota et al. | |
| 2003/0006418 A1 | 1/2003 | Emerson et al. | |
| 2003/0016863 A1 | 1/2003 | Risson | |
| 2003/0123164 A1 | 7/2003 | Hsu et al. | |

OTHER PUBLICATIONS

U.S. Appl. No. 10/881,814 entitled "Light Emitting Devices Having Current Locking Structures and Methods of Fabricating Light Emitting Devices Having Current Blocking Structures" filed Jun. 30, 2004.

U.S. Appl. No. 10/899,793 entitled "Light Emitting Devices Having a reflective Bond Pad and Methods of Fabricating Light Emitting Devices having Reflective Bond Pads" filed Jul. 27, 2004.

International Search Report and Written Opinion for PCT/US2006/002579; Date of mailing Aug. 1, 2006.

Chen et al. "Pit formation in GaInN quantum wells" *Applied Physics Letters* 72(6):710-712 (1998).

Hangleiter et al.; "Suppression of Nonradiative Recombination by V-shaped Pits in GaInN/GaN Quantum Wells Produces a Large Increase in the Light Emission Efficiency" *Physical Review Letters* 95:127402-1—127402-4 (2005).

Takahashi et al. "Effect of Intentionally Formed 'V-Defects' on the Emission Efficiency of GaInN Single Quantum Well" *Jpn. J. Appl Phys.* 39:L569-L571 (2000).

\* cited by examiner

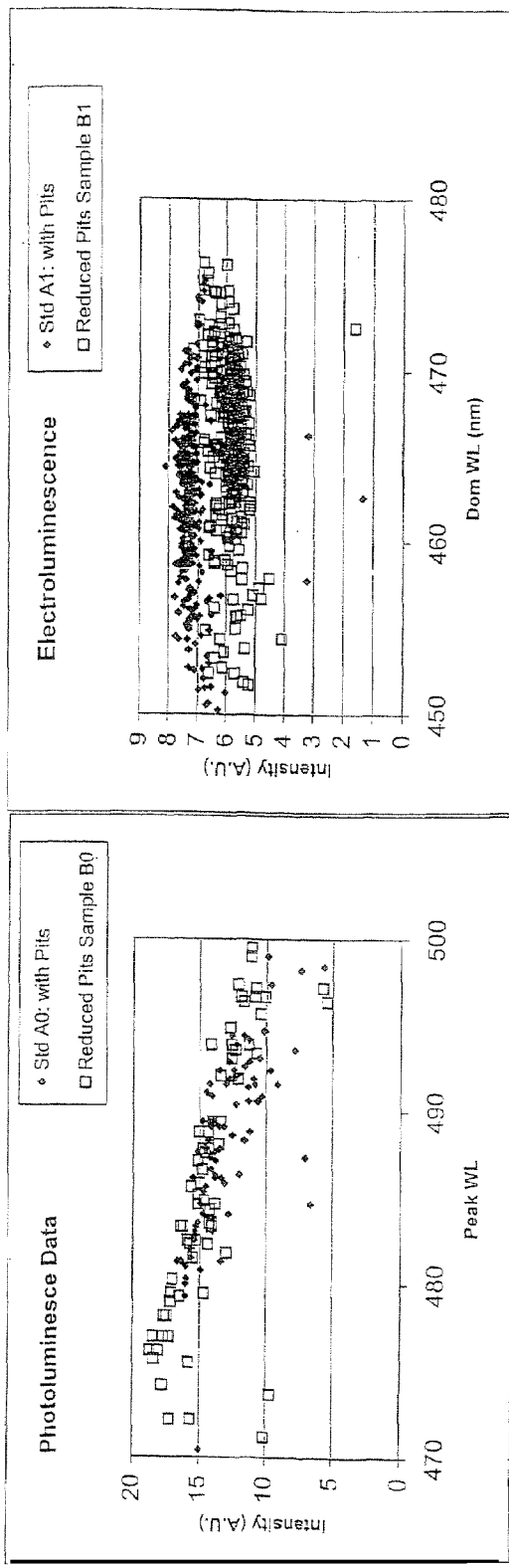
Figure 6B
Figure 6A
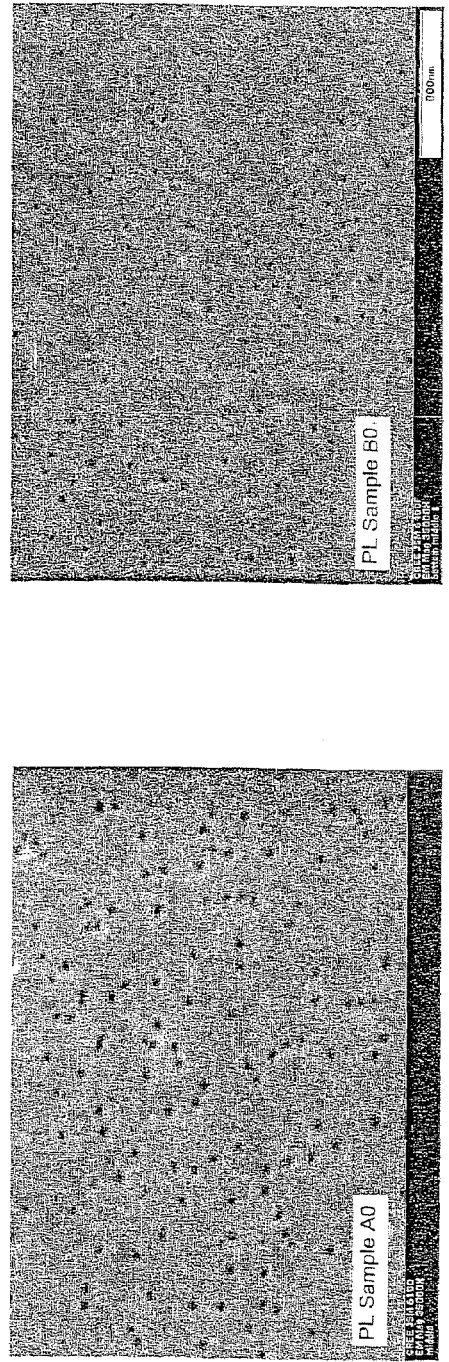
Figure 5B
Figure 5A

METHODS OF FORMING LIGHT EMITTING DEVICES WITH ACTIVE LAYERS THAT EXTEND INTO OPENED PITS

CLAIM OF PRIORITY

The present application is a divisional of and claims priority from U.S. application Ser. No. 11/118,987, filed Apr. 29, 2005 now U.S. Pat. No. 7,446,345, entitled "LIGHT EMITTING DEVICES WITH ACTIVE LAYERS THAT EXTEND INTO OPENED PITS," which is assigned to the assignee of the present application, the disclosure of which is hereby incorporated herein by reference as if set forth fully.

FIELD OF THE INVENTION

This invention relates to microelectronic devices and fabrication methods therefor, and more particularly to structures which may be utilized in Group III nitride semiconductor devices, such as light emitting diodes (LEDs).

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent lamp.

One difficulty in fabricating Group III nitride based LEDs, such as gallium nitride based LEDs, has been with the fabrication of high quality gallium nitride. Typically, gallium nitride LEDs have been fabricated on sapphire or silicon carbide substrates. Such substrates may result in mismatches between the crystal lattice of the substrate and the gallium nitride. Various techniques have been employed to overcome potential problems with the growth of gallium nitride on sapphire and/or silicon carbide. For example, aluminum nitride (AlN) may be utilized as a buffer between a silicon carbide substrate and a Group III active layer, particularly a gallium nitride active layer. Typically, however, aluminum nitride is insulating rather than conductive. Thus, structures with aluminum nitride buffer layers typically require shorting contacts that bypass the aluminum nitride buffer to electrically link the conductive silicon carbide substrate to the Group Iii nitride active layer.

Alternatively, conductive buffer layer materials such as gallium nitride (GaN), aluminum gallium nitride (AlGaN), or combinations of gallium nitride and aluminum gallium nitride may allow for elimination of the shorting contacts typically utilized with AlN buffer layers. Typically, eliminating the shorting contact reduces the epitaxial layer thickness, decreases the number of fabrication steps required to produce devices, reduces the overall chip size, and/or increases the device efficiency. Accordingly, Group III nitride devices may be produced at lower cost with a higher performance. Nevertheless, although these conductive buffer materials may offer these advantages, their crystal lattice match with silicon carbide is less satisfactory than is that of aluminum nitride.

The above described difficulties in providing high quality gallium nitride may result in reduced efficiency of the device. Attempts to improve the output of Group III nitride based devices have included differing configurations of the active regions of the devices. Such attempts have, for example, included the use of single and/or double heterostructure active regions. Similarly, quantum well devices with one or more Group III nitride quantum wells have also been described.

One characteristic of gallium nitride that has typically been associated with poor quality is the presence of dislocation defects. These defects often appear as "V" shapes or pits that surround the dislocation. Historically, Cree, Inc. has attempted to close as many of these pits as possible before the formation of the active region of the device since it was believed that they degraded device performance attributes such as output power and stability. To this end, a "pit closing" layer has been used to close the pits prior to formation of the active region of the device. While prior Cree LEDs may have included some pits that extended through the active region, efforts were made to reduce the number of pits that extended through the active region. Such prior Cree LEDs included, for example, the multi-quantum well LEDs described in United States Patent Publication No. US2003/0006418A1 that published on Jan. 9, 2003 and in U.S. Pat. Nos. 6,664,560 and 6,734,003 which are commonly assigned to Cree, Inc. and the disclosures of which are incorporated herein as if set forth in their entirety.

In addition to the efforts at closing the pits that form at dislocations, U.S. Pat. Nos. 6,329,667 and 6,693,303 generally describe the isolation of active layer(s) from dislocations by forming a barrier layer in the pit that isolates the active layer(s) from the dislocation. For example, as described in the abstract of U.S. Pat. No. 6,693,303, a nitride semiconductor device is composed of Group III nitride semiconductors. The device includes an active layer, and a barrier layer made from a predetermined material and provided adjacent to the active layer. The barrier layer has a greater band-gap than that of the active layer. The device also includes a barrier portion formed of the predetermined material for surrounding a threading dislocation in the active layer.

SUMMARY OF THE INVENTION

Some embodiments of the present invention provide light emitting devices and methods of fabricating light emitting devices that include an active region comprising a plurality of layers and a pit opening region on which the active region is disposed. The pit opening region is configured to provide open pits by expanding a size of openings of a plurality of pits to a size sufficient for the plurality of layers of the active region to extend into the pits.

In additional embodiments of the present invention, the active region comprises a plurality of quantum wells and a hole injection layer. Layers of the quantum wells and the hole injection layer extend into the pits. The pits may remain open through the quantum wells and the hole injection layer. A contact layer may be provided on the hole injection layer and extending into the pits. The contact layer may close the pits.

In further embodiments of the present invention, the pits are closed by a layer on the quantum wells and the hole injection layer opposite the pit opening region.

In some embodiments of the present invention, the pit opening region comprises a superlattice structure. In other embodiments, the pit opening region may be bulk GaN or AlGaN.

In still further embodiments of the present invention, the pits surround corresponding dislocations and the plurality of layers extend to the respective dislocations. At least one of the pits of the plurality of pits may originate in a layer disposed between the pit opening region and a substrate on which the pit opening region is provided.

In additional embodiments of the present invention, the active layers comprise Group III-nitride based active layers. In some embodiments, the pit opening region and the active layers are provided on a SiC substrate. In other embodiments, the pit opening region and the active layers are provided on a sapphire substrate.

In further embodiments, the light emitting device comprises a GaN based light emitting diode. The light emitting device may have a dominant output wavelength of about 460 nm. In some embodiments, the light emitting device has a radiant output normalized to chip size of at least about 0.27 $\mu W/\mu m^2$ and in further embodiments, a radiant output normalized to chip size of at least about 0.30 $\mu W/\mu m^2$ or even 0.33 $\mu W/\mu m^2$. In some embodiments, the light emitting device has a radiant output normalized to contact size of at least about 0.50 $\mu W/\mu m^2$ and in further embodiments, a radiant output normalized to chip size of at least about 0.56 $\mu W/\mu m^2$ or even 0.62 $\mu W/\mu m^2$. In further embodiments, the light emitting device has a contact area of at least 600,000 $\mu m^2$ and a radiant output normalized to contact size of at least about 0.24 $\mu W/\mu m^2$ and, in some embodiments, a radiant output normalized to contact size of at least about 0.29 $\mu W/\mu m^2$ or even 0.34 $\mu W/\mu m^2$ In additional embodiments of the present invention, the light emitting device has a dominant output wavelength of about 527 nm. The light emitting device may have a radiant output normalized to chip size of at least about 0.1 $\mu W/\mu m^2$ and, in some embodiments, a radiant output normalized to chip size of at least about 0.13 $\mu W/\mu m^2$. The light emitting device may have a radiant output normalized to contact size of at least about 0.19 $\mu W/\mu m^2$ and, in some embodiments, a radiant output normalized to contact size of at least about 0.25 $\mu W/\mu m^2$.

Some embodiments of the present invention provide Group III nitride based light emitting devices and methods of fabricating Group III nitride light emitting devices that include a pit opening layer having a plurality of pits therein, a Group III nitride based active region on the pit opening layer, the active region comprising a plurality of layers that extend into the pits, a p-type Group III nitride layer on active region and extending to the pits and first and second contacts that electrically contact the active region. The light emitting device has a radiant output normalized to contact size of greater than 0.5 $\mu W/\mu m^2$ for a dominant output wavelength of about 460 nm or greater than 0.19 $\mu W/\mu m^2$ for a dominant output wavelength of about 527 nm In embodiments of the present invention where the light emitting device has a dominant output wavelength of about 460 nm, the light emitting device may have a radiant output normalized to contact size of at least about 0.56 $\mu W/\mu m^2$ and, in some embodiments, a radiant output normalized to contact size of at least about 0.62 $\mu W/\mu m^2$.

In embodiments of the present invention where the light emitting device has a dominant output wavelength of about 527 nm, the light emitting device may have a radiant output normalized to contact size of at least about 0.25 $\mu W/\mu m^2$.

In further embodiments of the present invention, the active region comprises a plurality of quantum wells. Furthermore, the pit opening layer may comprise a Group III nitride superlattice structure. In some embodiments, the pit surrounds a dislocation and the plurality of layers extend to the dislocation.

In additional embodiments of the present invention, at least one of the pits of the plurality of pits originates in a layer disposed between the pit opening layer and a substrate on which the pit opening layer is provided. Furthermore, the light emitting device may include a SiC substrate and the pit opening layer is disposed on the SiC substrate. In other embodiments, the light emitting device includes a sapphire substrate and the pit opening layer is disposed on the sapphire substrate.

In further embodiments of the present invention, the p-type Group III nitride layer closes the pits.

In some embodiments of the present invention, methods of fabricating a light emitting devices include controlling growth conditions of a layer of semiconductor material to provide low mobility of species on a growth surface of a layer on which active layers of the light emitting device are grown so as to open pits at threading dislocations in the layer of semiconductor material, growing the active layers to extend into the pits in the layer of semiconductor material and growing a hole injection layer on the active layers to extend into the pits.

In further embodiments of the present invention, the light emitting device comprises a Group III-V based light emitting device and controlling growth conditions comprises controlling V/III ratio and/or growth temperature. The semiconductor layer may comprise a Group III-nitride superlattice grown at a temperature of less than about 1000° C. in a nitrogen containing environment.

In additional embodiments, the methods include growing a contact layer on the active layers to extend into the pits. The contact layer may be grown to close the pits. The layer of semiconductor material may be grown on a SiC or sapphire substrate.

Some embodiments of the present invention provide methods of fabricating light emitting devices that include forming a pit opening layer so as to enhance the opening of pits associated with dislocations in the pit opening layer, forming an active region on the pit opening layer, the active region comprising a plurality of layers that extend into the pits opened by the pit opening layer and forming a hole injection layer on the active region, the hole injection layer extending into the pits. A contact layer may also be formed on the hole injection layer, the contact layer extending into the pits. The contact layer may be formed to close the pits.

In further embodiments of the present invention, forming an active region comprises forming an active region comprising a plurality of Group III-nitride quantum well layers that extend into the pits. Forming a pit opening layer may comprise forming a Group III-nitride superlattice at a temperature of less than about 1000° C. in a nitrogen environment.

In additional embodiments, the light emitting devices comprise Group III-nitride based light emitting devices. The pit opening layer may be formed on a silicon carbide substrate or a sapphire substrate.

Additional embodiments of the present invention provide light emitting devices and methods of fabricating light emitting devices that include an active region, a contact layer on the active region and a pit opening region on which the active region and the contact layer are disposed. The pit opening region is configured to provide open pits by expanding a size of openings of a plurality of pits to a size sufficient for the contact layer to extend into the pits. The active region may not extend into the pits. The contact layer may comprise p-type AlGaN and/or GaN.

BRIEF DESCRIPTION OF THE DRAWINGS

Other features of the present invention will be more readily understood from the following detailed description of specific embodiments thereof when read in conjunction with the accompanying drawings, in which:

FIGS. 5A and 5B are images of devices having pits with and without a pit opening layer according to embodiments of the present invention; and FIGS. 6A and 6B are graphs of photoluminescence data and electroluminescence data, respectively, for structures with open pits and with closed pits as seen in FIGS. 5A and 5B.

DETAILED DESCRIPTION OF PREFERRED EMBODIMENTS

Figure 1:
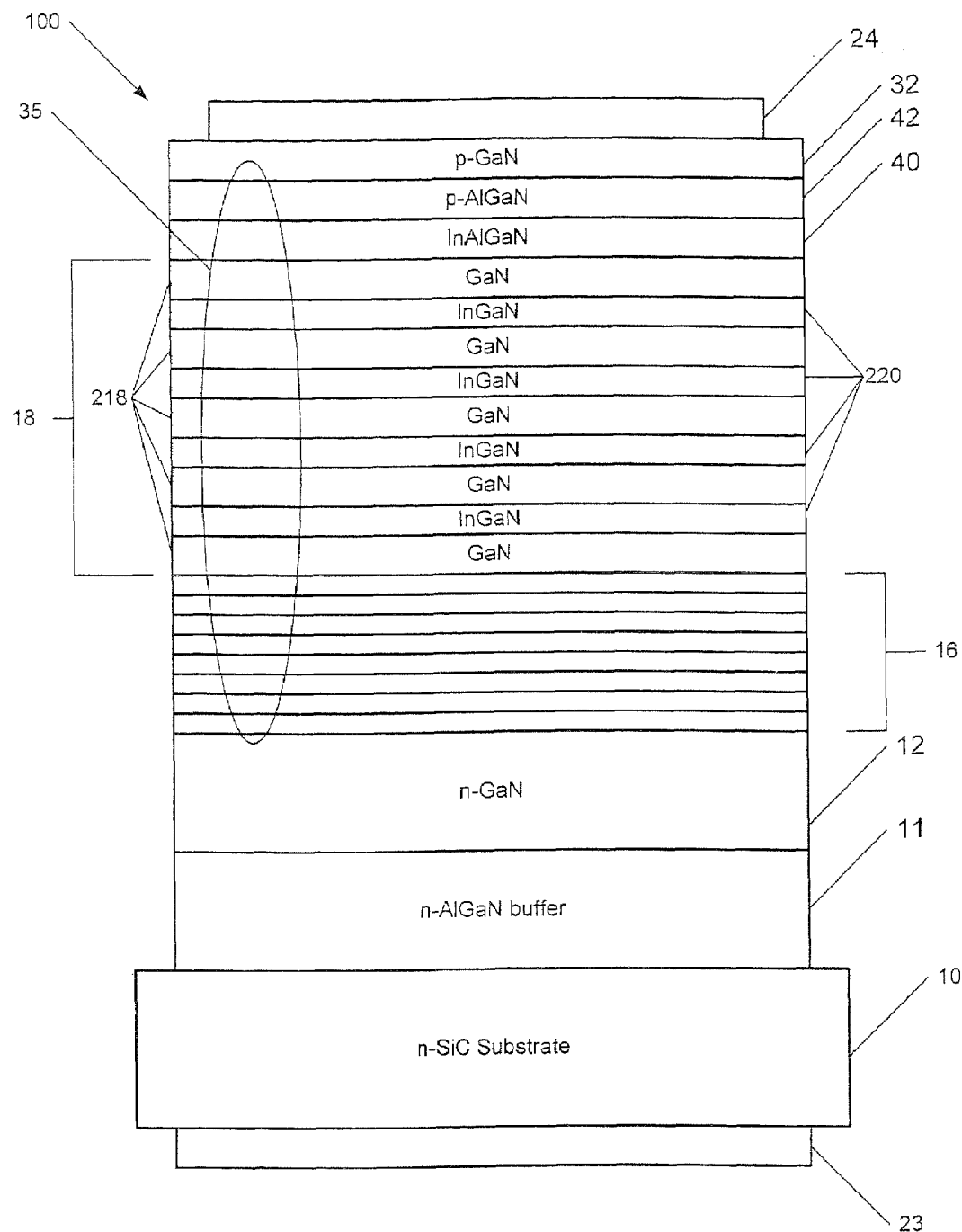
FIG. 1 is a schematic cross-section illustration of a Group III nitride light emitting diode incorporating embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

As discussed above, nitride based light emitting devices on sapphire or SiC substrates include threading dislocations. These threading dislocations may generate pits with a threading dislocation at the core of the pit. The pit originates from the threading dislocation. As discussed above, historically these pits were considered detrimental to device performance and growth conditions in the LED structure were chosen to close the pits. The pits may be closed because changing the growth conditions can affect the size of a pit. It has been discovered, however, that performance of nitride based light emitting devices may be improved by opening the pits rather than closing the pits. A pit that is open appears as a "V" when viewed in an SEM or other technique. A pit is considered open if at least some of the active layers of the light emitting device extend into the pit. Thus, embodiments of the present invention provide for opening of pits in a semiconductor device light emitting devices.

The opening of the pits may be provided by controlling the growth conditions of a layer or layers grown after a pit forms at a threading dislocation. Growth conditions that provide for pit opening or expansion typically have low mobility of species on the growth surface (e.g. a high V/III ratio and/or low growth temperature). Examples of conditions under which opening of the pits may occur are described in further detail below. However, any suitable technique for opening pits such that active layers of the device extend into the pits may be utilized.

The actual number of pits that are sufficiently open so that active layers extend into the pits may be less than 5% of the total number of pits. Increases in brightness may be obtained over conventional structures that attempt to close pits even if a relatively small number of the pits are open. For example, a typical buffer layer on a SiC substrate for a light emitting device may have $2 \times 10^9$ pits and an increase in brightness may be seen if $1 \times 10^8$ pits/cm$^2$ or if $1 \times 10^9$ pits/cm$^2$ are open.

Some embodiments of the present invention provide for pit opening layers that are formed so that the pits expand in size so that active layers of the device extend into the pits. The active layers that extend into the pits may include well layers and hole injection layers. In some embodiments, well layers, hole injection layers and contact layers may be grown down into the open pits. The pits may form in many different places in the light emitting device stricture. For example, the pits may form in a buffer layer(s) between the pit opening layer and a substrate or in the pit opening layer itself. Thus, the pits may be opened in a layer other than a light generating layer and may be maintained open through a light generating layer. The pits may be closed by a layer subsequent to the light generating layers, for example by a contact layer. Subsequent closing of pits after the active layers extend into the pits may improve the robustness of the device, for example, by reducing the rate of degradation of the device or may improve electro-static discharge (ESD) tolerance of the device.

By opening pits in a light emitting device so that the active layers extend into the pits on the sidewalls of the pits, the forward voltage characteristic ($V_f$) of the light emitting device may be reduced. Furthermore, extending the active layers into the pits may also increase the optical efficiency and/or wall plug efficiency of devices.

While not being bound by any particular theory of operation, by forming the active layers to extend into the pits and on the sidewalls of the pits the hole injection and active layers may be brought closer together. Furthermore, extending the active layers of the device into the pits may increase the junction surface area.

Figure 3:
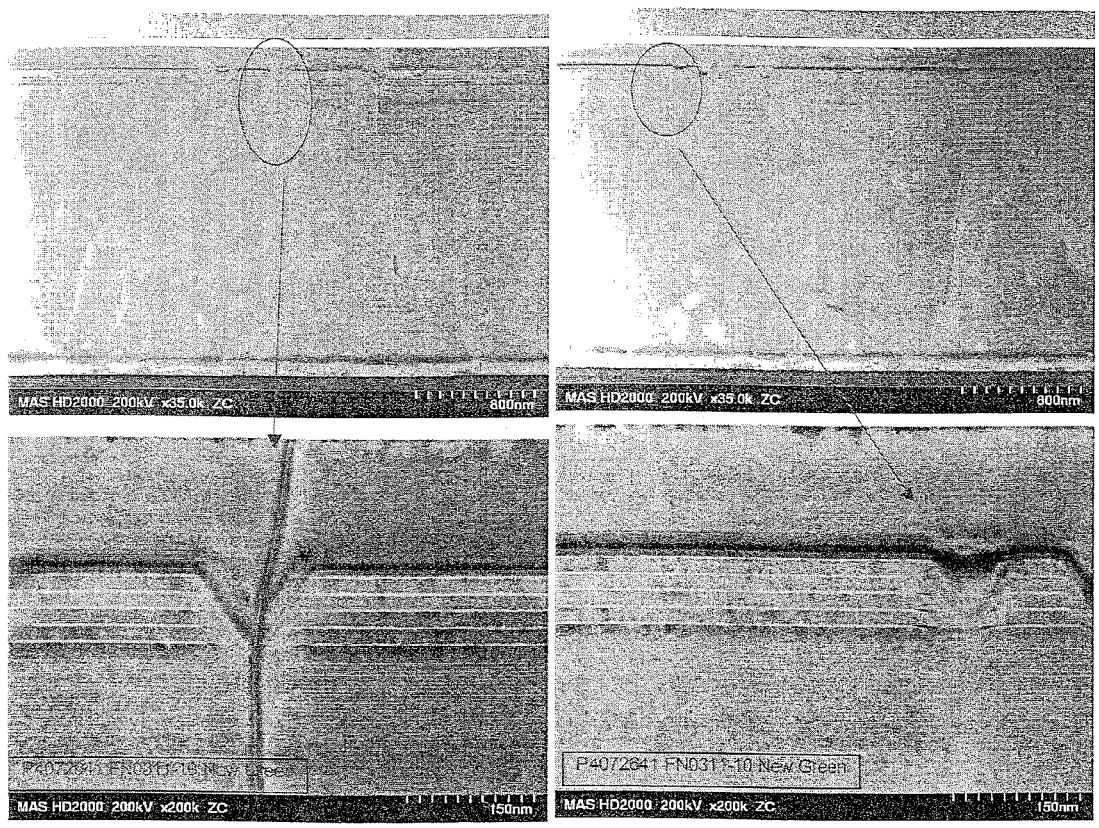
FIG. 3 includes TEM images of pits that extend through the active region of a device.

FIG. 3 includes transmission electron microscopy (TEM) images of pits having active layers, capping layers, hole injection layers, and p-contact layers that extend into the pits. As seen in FIG. 3, the pits extend from a superlattice structure at the lower portion of the images, through a multi-quantum well structure where the layers of the quantum wells extend into the pits and are filled with a p-type hole injection layer and p-type contact layer. Because of the conical shape of the pit, a cross-section of the pit is visible which may obfuscate the active area layers extending into the pit, however, detailed observation by those skilled in the art will reveal that active layers in FIG. 3 do extend into the pit surrounding the clearly visible dislocations.

Figure 4:
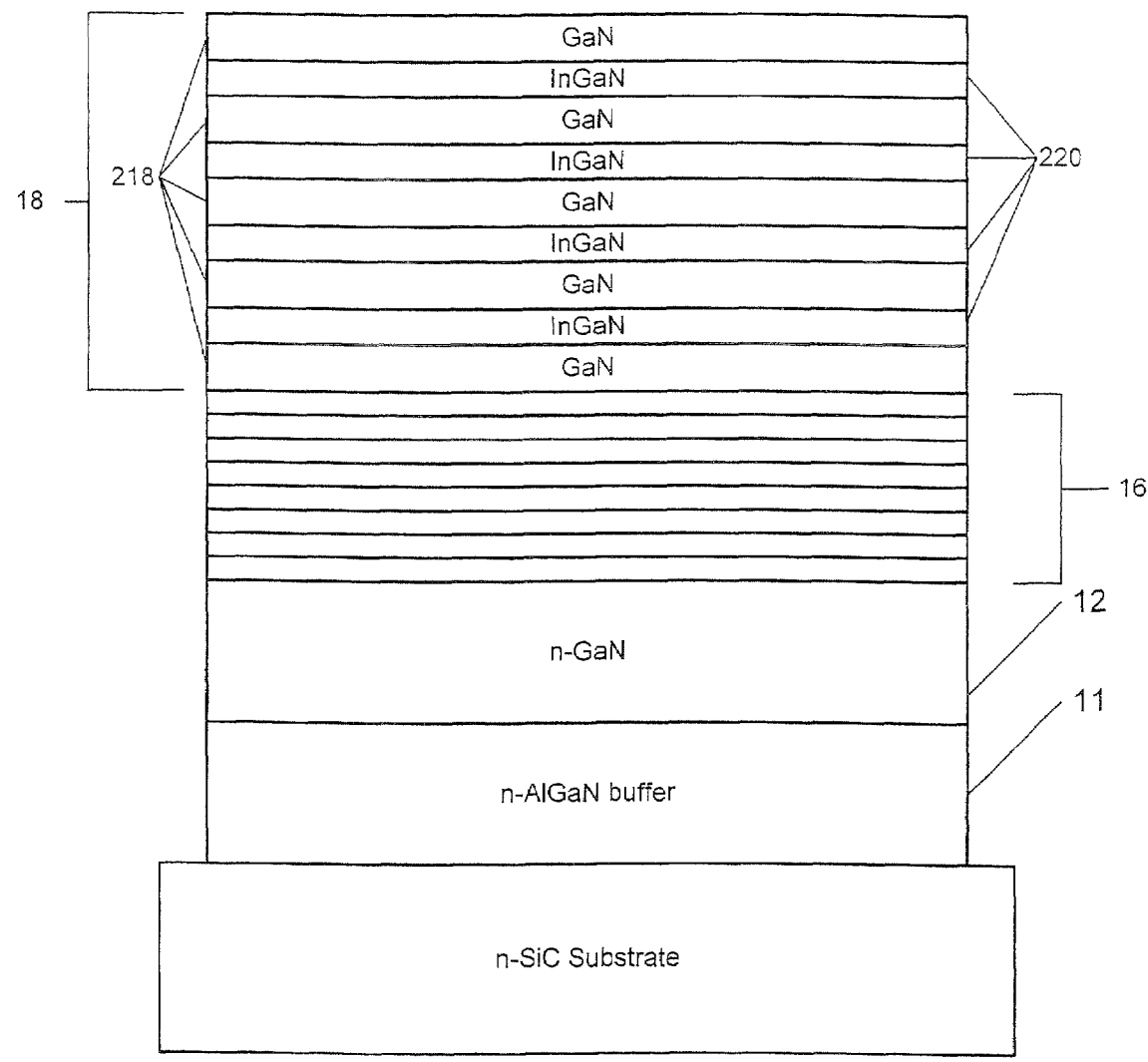
FIG. 4 is a schematic cross-section of a test structure utilized to characterize pits.

In order to characterize the pits further, test structures and LEDs were grown, fabricated into test LEDs when appropriate, and characterized. Test structures are as illustrated in FIG. 4. In this case, the LED structure from FIG. 1 (described in further detail below) is deposited on a substrate, but the capping, hole injection, and p-contact layers are omitted. The optical properties of the test structures were characterized using room temperature photoluminescence (RTPL) and the surface morphology was characterized using scanning electron microscopy (SEM). The LED structure is as depicted in FIG. 1, and the structures were characterized using a relative electroluminescence "quicktest" in which the electroluminescent properties of LED structures can be compared either to each other qualitatively or to actual packaged lamp data empirically but which in itself does not represent the actual output power of the LED chip or lamp.

FIGS. 5A and 5B are plan view SEM images of active layers deposited in the layer sequence depicted in FIG. 4. FIG. 5A is an image of a layer stack with a correctly deposited pit opening layer while FIG. 5B is an image of layer stack with an incorrectly deposited pit opening layer. Although both structures have similar pit densities, since this is determined in large part by the threading defect density associated with the buffer layer, the pits in the structure depicted in FIG. 5A are substantially larger than the pits in FIG. 5B.

FIG. 6A is a graph of photoluminescence data for test structures with open pits and test structures with closed pits. As seen in FIG. 6A, there is no difference in the relative photoluminescence intensity when the structure with open pits is compared to the structure with closed pits. FIG. 6B is a graph of electroluminescence data for devices with open pits and devices with closed pits. As seen in FIG. 6B, the electroluminescence data clearly demonstrates that the structures with open pits has substantially higher optical efficiency than the structure with closed pits.

Exemplary embodiments of the present invention will be described with reference to FIG. 1 that illustrates a light emitting diode (LED) structure 100. The LED structure 100 of FIG. 1 includes a substrate 10, which, in some embodiments, is preferably 4H or 6H n-type silicon carbide. In particular embodiments of the present invention, the substrate 10 is a SiC substrate having a thickness of from about 50 to about 800 µm and in some embodiments, about 100 µm. In other embodiments, the substrate 10 may also comprise sapphire, bulk gallium nitride or another suitable substrate.

Also included in the LED structure 100 of FIG. 1 is a layered semiconductor structure comprising gallium nitride-based semiconductor layers on substrate 10. Namely, the LED structure 100 illustrated includes the following layers: a conductive buffer layer 11, a first silicon-doped GaN layer 12, a superlattice structure 16 comprising layers of silicon-doped GaN and/or InGaN, an active region 18, which may be provided by a multi-quantum well structure, an undoped InAlGaN layer 40, an AlGaN layer 42 doped with a p-type impurity, and a GaN contact layer 32, also doped with a p-type impurity. The structure further includes an n-type ohmic contact 23 on the substrate 10 and a p-type ohmic contact 24 on the contact layer 32. In some embodiments, a second silicon doped GaN layer (not shown) may be disposed between the GaN layer 12 and the superlattice 16.

In some embodiments, the buffer layer 11 may be n-type AlGaN. Examples of buffer layers between silicon carbide and group ITT-nitride materials are provided in U.S. Pat. Nos. 5,393,993, 5,523,589, and 6,459,100 assigned to the assignee of the present invention, the disclosures of which are incorporated by reference as if fully set forth herein. Similarly, embodiments of the present invention may also include structures such as those described in U.S. Pat. No. 6,201,262 entitled "Group III Nitride Photonic Devices on Silicon Carbide Substrates With Conductive Buffer Interlay Structure," the disclosure of which is incorporated herein by reference as if set forth fully herein.

In some embodiments, the buffer layer 11 may be AlGaN doped with Si and having a thickness of from about 100 to about 10,000 Å. In certain embodiments the thickness is about 2000 Å. The GaN layer 12 may be doped with Si and may have a thickness of from about 5000 to 50,000 Å thick and a silicon doping level of about $5 \times 10^{17}$ to about $5 \times 10^{18}$ cm$^{-3}$. In particular embodiments, the GaN layer 12 is about 1800 nm thick with a silicon doping level of about $2 \times 10^{18}$ cm$^{-3}$.

In some embodiments, if present, a second GaN layer (not shown) may be between about 10 and about 5000 Å thick. The second GaN layer (not shown) may be doped with silicon at a level $1 \times 10^{17}$ cm$^{-3}$ to about $5 \times 10^{19}$ cm$^{-3}$. In a particular embodiment, the thickness of this layer is about 1250 Å and the doping is about $2 \times 10^{18}$ cm$^{-3}$.

As illustrated in FIG. 1, a superlattice structure 16 according to some embodiments of the present invention includes alternating layers of $In_XGa_{1-X}N$ and $In_YGa_{1-Y}N$, wherein X is between 0 and 1 and X is not equal to Y. In some embodiments, X=0 and the thickness of each of the alternating layers of InGaN is about 5-40 Å thick, and the thickness of each of the alternating layers of GaN is about 5-100 Å thick. The superlattice structure 16 may include from about 3 to about 50 periods (where one period equals one repetition each of the $In_XGa_{1-X}N$ and $In_YGa_{1-Y}N$ layers that comprise the superlattice). In one embodiment, the superlattice structure 16 comprises 25 periods. In another embodiment, the superlattice structure 16 comprises 10 periods. The number of periods, however, may be decreased by, for example, increasing the thickness of the respective layers. Thus, for example, doubling the thickness of the layers may be utilized with half the number of periods. The number of periods may also be increased. Alternatively, the number and thickness of the periods may be independent of one another. The superlattice structure 16 may provide a pit generation layer as described in further detail below with reference to FIG. 2.

In certain embodiments, the superlattice structure 16 may have from 3 to 35 periods of InGaN/GaN. The thickness of the periods may be from about 30 to about 100 Å. In particular embodiments of the present invention, twenty five (25) periods of InGaN/GaN are provided with the thickness of a period of layers being about 50 Å and the thickness of the GaN or InGaN layer being about 10 Å with the other layer making up the remainder. In certain embodiments, the GaN layers are about 10 Å thick and the InGaN layers are about 40 Å thick.

In some embodiments, the superlattice 16 is doped with an n-type impurity such as silicon at a level of from about $1 \times 10^{17}$ cm$^{-3}$ to about $5 \times 10^{19}$ cm$^{-3}$. Such a doping level may be actual doping or average doping of the layers of the superlattice 16. If such doping level is an average doping level, then it may be beneficial to provide doped layers adjacent the superlattice structure 16 that provide the desired average doping in which the doping of the adjacent layers is averaged over the adjacent layers and the superlattice structure 16.

In some embodiments, the superlattice structure 16 may be replaced by a single, uniform layer of $In_XGa_{1-X}N$ or GaN. The total layer thickness, In content, and doping level may be derived from the parameters set forth for the embodiment of the superlattice case, above.

In certain embodiments of the present invention, the active region 18 may comprise a single or multi-quantum well structure as well as single or double heterojunction active regions. In particular embodiments of the present invention, the active region 18 comprises a multi-quantum well structure that includes multiple InGaN quantum well layers separated by barrier layers as illustrated in FIG. 1.

The active region 18 may include a multi-quantum well structure that includes multiple InGaN quantum well layers 220 separated by barrier layers 218. In some embodiments, the barrier layers 218 comprise $In_XGa_{1-X}N$ where $0 \leq X < 1$. In some embodiments, the indium composition of the barrier layers 218 is less than that of the quantum well layers 220, so that the barrier layers 218 have a higher bandgap than quantum well layers 220. The barrier layers 218 and quantum well layers 220 may be undoped (i.e. not intentionally doped with an impurity atom such as silicon or magnesium). However, it may be desirable to dope the barrier layers 218 with Si at a level of less than $5 \times 10^{19}$ cm$^{-3}$, particularly if ultraviolet emission is desired.

In further embodiments of the present invention, the barrier layers 218 comprise $Al_XIn_YGa_{1-X-Y}N$ where $0 < X < 1$, $0 \leq Y < 1$ and $X+Y \leq 1$. By including aluminum in the crystal of the barrier layers 218, the barrier layers 218 may be more closely lattice-matched to the quantum well layers 220, thereby allowing improved crystalline quality in the quantum well layers 220, which can increase the luminescent efficiency of the device.

In particular embodiments of the present invention, the active region 18 includes 3 or more quantum wells and in certain embodiments, eight (8) quantum wells are provided. In general, the number of wells is increased in order to increase the total power output of the LED. The thickness of the quantum well structures may be from about 30 to about 250 Å. In particular embodiments of the present invention, the thickness of a quantum well structure may be about 150 Å with the thickness of the well layer being about 10 to about 50 Å. In certain embodiments, the thickness of the quantum well layers is roughly 20 Å and the thickness of the barrier layers is roughly 130 Å. The mole fraction X of the In in the $In_XGa_{1-X}N$ quantum well is adjusted to achieve the desired wavelength emission of the LED. In the case of 460 nm light emission, the mole fraction X is roughly 0.12. In the case of 527 nm light emission, the mole fraction X is roughly 0.30.

In some embodiments, a Group III-nitride capping layer 40 that includes Indium may be provided on the active region 18 and, more specifically, on the quantum well 220 of the active region 18. The Group III-nitride capping layer 40 may include InAlGaN between about 10 and about 320 Å thick. The capping layer 40 may be of uniform composition, multiple layers of different compositions and/or graded composition. In particular embodiments of the present invention, the capping layer 40 includes a first capping layer having a composition of $In_XAl_YGa_{1-x-y}N$, where $0 < x \leq 0.2$ and $0 \leq y \leq 0.4$ and has a thickness of from about 10 to about 200 Å and a second capping layer having a composition of $In_WAl_ZGa_{1-w-z}N$, where $0 < w \leq 0.2$ and $y \leq z < 1$ and has a thickness of from about 10 to about 120 Å. In certain embodiments of the present invention, the first capping layer has a thickness of about 80 Å, x=0.1 and y=0.25 and the second capping layer has a thickness of about 30 Å, w=0.05 and z=0.55. The capping layer 40 may be grown at a higher temperature than the growth temperatures in the active region 18 in order to improve the crystal quality of the layer 40. Additional layers of undoped GaN or AlGaN may be included in the vicinity of layer 40. For example, a thin layer of GaN may be provided between a last quantum well layer and the capping layer 40. The capping layer 40 that includes indium may be more closely lattice matched to the quantum wells of the active region 18 and may provide a transition from the lattice structure of the active region 18 to the lattice structure of the p-type layers. When implemented correctly, such a structure will result in increased brightness of the device.

An AlGaN hole injection layer 42 doped with a p-type impurity such as magnesium is provided on the capping layer 40. The AlGaN layer 42 may be between about 50 and about 2500 Å thick and, in particular embodiments, is about 150 Å thick. The AlGaN layer 42 may be of the composition of $AlGa_{1-x}N$, where $0 \leq x \leq 0.4$. In particular embodiments of the present invention, x=0.23 for the AlGaN layer 42. The AlGaN layer 42 may be doped with Mg. In some embodiments of the present invention, the layer 42 may also include indium.

A contact layer 32 of p-type GaN is provided on the layer 42 and may be from about 250 to abut 10,000 Å thick and in some embodiments, about 1500 Å thick. In some embodiments, the contact layer 32 may also include Indium. Ohmic contacts 24 and 23 are provided on the p-GaN contact layer 32 and the substrate 10, respectively. In particular embodiments of the present invention, the ohmic contact 24 to the p-type material is an ultra-thin ohmic contact as described in further detail below.

In additional embodiments of the present invention, the LED stricture illustrated in FIG. 1 includes a spacer layer disposed between the superlattice 16 and the active region 18. The spacer layer may comprise undoped GaN. The presence of the optional spacer layer between the doped superlattice 16 and active region 18 may deter silicon impurities from becoming incorporated into the active region 18. This, in turn, may improve the material quality of the active region 18 that provides more consistent device performance and better uniformity.

Figure 2:
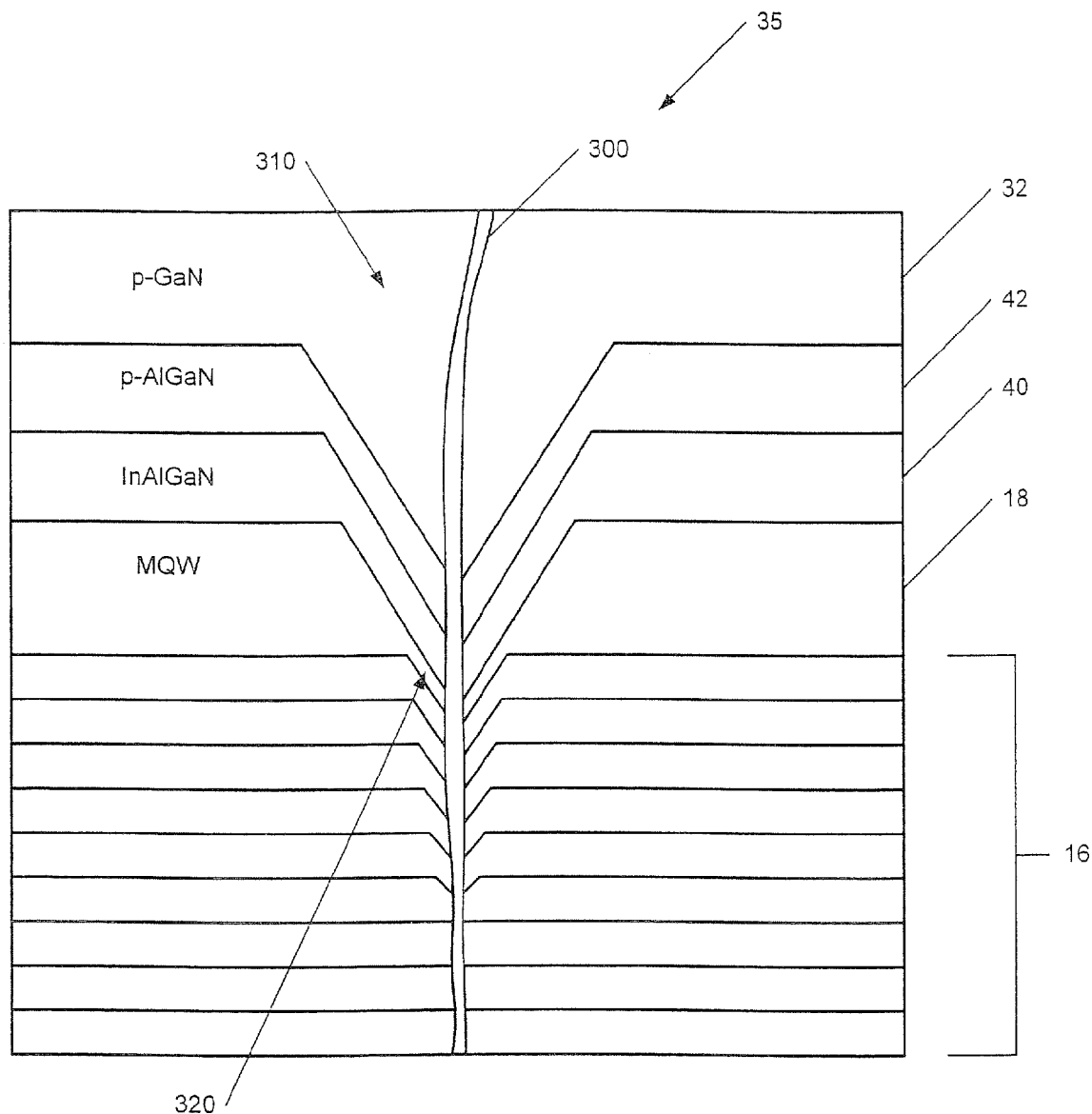
FIG. 2 is a schematic cross-section illustration of a portion of the Group III nitride light emitting diode of FIG. 1.

FIG. 2 is a more detailed view of the portion 35 of the structure 100 of FIG. 1 illustrating a pit structure according to some embodiments of the present invention. As seen in FIG. 2, the active region 18 is illustrated as a single layer for clarity but may be the multi-quantum well structure illustrated in FIG. 1. FIG. 2 further illustrates a pit 310 or "V" defect that extends through the active region 18. The layer(s) of the active region 18 extend along the sidewalls of the pit 310 and into the pit 310. In particular embodiments, the layers of the active region 18 extend into the pit 310 towards and, in some embodiments, to a dislocation 300 that may be present at the apex of the pit 310. Thus, a region 320 of the active region 18 is provided on a sidewall of the pit 310.

Furthermore, the pit 310 is open above the active region 18 such that the hole injection layer 42 and the p-type contact layer 32 extend into the pit 310. While not being bound by any particular theory of operation, the inventors presently believe that improved hole injection may be provided by the hole injection layer 42 extending into the pit 310.

As is further illustrated in FIG. 2, the pit 310 may be closed by the p-type contact layer 32. By closing the pit 310 with the p-type contact layer 32, the device may be more resistant to damage from ESD and/or may exhibit decreased degradation.

While the pit 310 is illustrated in FIG. 2 as originating in the superlattice 16, the pit 310 may be generated in a layer or layers below the superlattice 16 and the opening of the pit 310 increased by the superlattice 16. Thus, embodiments of the present invention provide for a pit opening layer where the pits may be generated in the pit opening layer or in a layer or layers below the pit opening layer. Thus, the superlattice 16 may act as a pit opening layer that expands or increases the size of openings associated with pits in the superlattice 16.

In some embodiments of the present invention, structures having the active layers extending into the pits may be provided in light emitting devices as described, for example, in U.S. patent application Ser. No. 10/899,793 entitled "LIGHT EMITTING DEVICES HAVING A REFLECTIVE BOND PAD AND METHODS OF FABRICATING LIGHT EMITTING DEVICES HAVING REFLECTIVE BOND PADS" and filed Jul. 27, 2004, U.S. Pat. No. 6,664,560, U.S. patent application Ser. No. 10/881,814 entitled "LIGHT EMITTING DEVICES HAVING CURRENT BLOCKING STRUCTURES AND METHODS OF FABRICATING LIGHT EMITTING DEVICES HAVING CURRENT BLOCKING STRUCTURES," filed Jun. 30, 2004, U.S. Patent Publication No. 2003/0123164 entitled "LIGHT EMITTING DIODES INCLUDING SUBSTRATE MODIFICATIONS FOR LIGHT EXTRACTION AND MANUFACTURING METHODS THEREFOR" and/or in U.S. Patent Publication No. 2003/0168663 entitled "REFLECTIVE OHMIC CONTACTS FOR SILICON CARBIDE INCLUDING A LAYER CONSISTING ESSENTIALLY OF NICKEL, METHODS OF FABRICATING SAME, AND LIGHT EMITTING DEVICES INCLUDING THE SAME," the disclosures of which is incorporated herein as if set forth in its entirety.

While embodiments of the present invention have been described with multiple quantum wells, the benefits from the teachings of the present invention may also be achieved in single quantum well structures. Thus, for example, a light emitting diode may be provided with a single occurrence of the structure 18 of FIG. 1 as the active region of the device. Thus, while different numbers of quantum wells may be utilized according to embodiments of the present invention, the number of quantum wells will typically range from 1 to 16 quantum wells. However, the number of quantum wells can be increased further through optimization of the structural parameters of the device.

Fabrication of light emitting devices according to some embodiments of the present invention will now be described with reference to FIG. 1. An n-type SiC substrate 10 may be fabricated as described, for example, in U.S. Pat. Nos. 4,866,005 and RE 34,861 or by other techniques known to those of skill in the art.

The n-type AlGaN buffer layer 11 may be fabricated by metal-organic chemical vapor deposition (MOCVD) at a temperature of from about 950° C. to about 1075° C. and in some embodiments of 1025° C., a pressure of from about 25 torr to about 250 torr and, in some embodiments, about 100 torr and utilizing TMA, TMG and $NH_3$ as source materials for the Al, Ga and N and silicon as an n-type dopant. Flow rates are specific to the reactor geometry and may be determined by those of skill in the art for a particular reactor geometry without undue experimentation in light of the disclosure herein. Furthermore, the GaN dots with AlGaN caps between the substrate and the AlGaN 11 layer may also be provided as described, for example, in U.S. Pat. No. 6,664,560 (the '560 patent), the disclosure of which is incorporated herein in its entirety. In some embodiments, the discontinuous SiN layer may also be provided on the AlGaN buffer layer 11 as described in the '560 patent.

The n-type GaN layer 12 is formed on the AlGaN layer 11 by MOCVD at a temperature of from about 975° C. to about 1150° C. and, in some embodiments of 1050° C., a pressure of from about 25 torr to about 500 torr and, in some embodiments of 200 torr, and utilizing TMG and $NH_3$ as source materials for the Ga and N and silicon as a n-type dopant. Flow rates are specific to the reactor geometry and may be determined by those of skill in the art for a particular reactor geometry without undue experimentation in light of the disclosure herein.

The superlattice structure 16 may be fabricated to enhance pit formation at dislocations in the superlattice structure 16. In particular, the superlattice structure 16 may be grown in an atmosphere of nitrogen and may be grown at a temperature of less than about 900° C. Growth in nitrogen ($N_2$) at temperatures of less than about 900° C. may serve to enhance pit formation in the superlattice. In particular embodiments of the present invention, the superlattice structure 16 is formed by sequentially forming by MOCVD alternating layers of InGaN with differing In amounts and in other embodiments, the superlattice structure 16 is formed by alternating layers of InGaN and GaN. The superlattice structure 16 may be formed by MOCVD using TEG or TMG, TMIn and $NH_3$ with a V/III ratio of at least 1000 as source materials and in the presence of $N_2$ at a temperature of from about 750° C. to about 900° C. and, in some embodiments, of 840° C. and a pressure of from about 25 tort to about 500 torr and, in some embodiments of about 100 torr. Flow rates are specific to the reactor geometry and may be determined by those of skill in the art for a particular reactor geometry without undue experimentation in light of the disclosure herein.

The active layers 18 are formed so as to extend into the pits that are generated in the superlattice structure 16. In some embodiments, this is provided by MOCVD growth of layers of GaN and InGaN to provide a series of quantum well structures as described, for example, in United States Patent Publication No. US2003/0006418A1 that published on Jan. 9, 2003, the disclosure of which is incorporated herein by reference as if set forth in its entirety. In particular embodiments, the quantum well structure may be formed by growing a GaN layer at a temperature of from about 800° C. to about 950° C. and, in some embodiments, at 875° C., a pressure of from about 25 torr to about 500 torr and, in some embodiments, about 100 torr and utilizing TMG or TEG and $NH_3$ as source materials for the Ga and N with a V/III ratio of at least 1000. The well layer of the quantum well layer may be provided by growing an InGaN layer at a temperature of from about 680° C. to about 780° C. and, in some embodiments, at 700° C. for 527 nm devices and 750° C. for 460 nm devices, a pressure of from about 25 torr to about 500 torr and, in some embodiments, about 100 torr and utilizing TMG or TEG, TMIn and $NH_3$ as source materials for the In, Ga and N with a V/III ratio of at least 1000. Flow rates are specific to the reactor geometry and may be determined by those of skill in the art for a particular reactor geometry without undue experimentation in light of the disclosure herein.

The InAlGaN layer 40 may be provided by MOCVD growth on the active layers 18. In particular embodiments, the InAlGaN layer 40 may be formed by growing an InAlGaN layer at a temperature of from about 800° C. to about 950° C. and, in some embodiments, at 875° C., a pressure of from about 25 torr to about 500 torr and, in some embodiments, about 100 Torr and utilizing TMIn, TMA, TEG and $NH_3$ as source materials for the In, Al, Ga and N. Flow rates are specific to the reactor geometry and may be determined by those of skill in the art for a particular reactor geometry without undue experimentation in light of the disclosure herein. The InAlGaN layer 40 may be formed to extend into the pits.

The p-type AlGaN layer 42 may be provided by MOCVD growth on the InAlGaN layer 40. In particular embodiments, the p-type AlGaN layer 42 may be formed by growing an AlGaN layer at a temperature of from about 850° C. to about 975° C. and, in some embodiments, at 950° C., a pressure of from about 25 torr to about 500 torr and, in some embodiments, about 100 torr and utilizing TMA, TEG, $NH_3$ and $CP_2MG$ as source materials for the Al, Ga and N and Mg as a p-type dopant. Flow rates are specific to the reactor geometry and may be determined by those of skill in the art for a particular reactor geometry without undue experimentation in light of the disclosure herein. The AlGaN layer 42 may provide a hole injection layer and may be formed to extend into the pits.

The p-type GaN layer 32 may be provided by MOCVD growth on the AlGaN layer 42. In particular embodiments, the p-type GaN layer 32 may be formed by growing an GaN layer at a temperature of from about 900° C. to about 1100° C. and, in some embodiments, at 1000° C., a pressure of from about 25 torr to about 500 torr and, in some embodiments, about 100 torr and utilizing TMG, $NH_3$ and $CP_2MG$ as source materials for the Ga and N and Mg as a p-type dopant. Flow rates are specific to the reactor geometry and may be determined by those of skill in the art for a particular reactor geometry without undue experimentation in light of the disclosure herein. The GaN layer 32 may provide a p-type contact layer and may be formed to extend into the pits.

In some embodiments, the fabrication of the superlattice 16, active layers 18 and the hole injection layer 42 may be carried out so that at least 5% of the dislocations have pits associated with them that extend through the active layers 18 and are open to the hole injection layer 42. In some embodiments, the number open pits may be nearly 100% of the number of dislocations.

An ohmic contact 23 to n-type SiC is provided on the SiC substrate 10 opposite the active region 18. The ohmic contact 23 may be formed by conventional methods. An ohmic contact 24 is also provided to the p-type GaN layer 32. Some embodiments of the present invention that incorporate a reflector layer may have a p-type electrode 24 that has a thickness of about 10 Å or less. In some embodiments of the present invention without a reflector layer, a p-type electrode 24 has a thickness of about 13 Å or greater.

In order to reduce and/or minimize absorption of light by the p-type electrode 24, the thickness of the p-type electrode may be reduced below 25 Å. In some embodiments, the p-type electrode 24 comprises platinum. Other materials may be used for the ohmic contact 24. For example, the ohmic contact 24 may comprise rhodium, zinc oxide, palladium, palladium oxide, titanium, nickel/gold, nickel oxide/gold, nickel oxide/platinum and/or titanium/gold. In some embodiments, the ohmic contact 24 has an average thickness less than 25 Å. In some embodiments, the ohmic contact 24 has an average thickness less than 15 Å. In some embodiments, the ohmic contact 24 has an average thickness less than 5 Å, and in further embodiments, the ohmic contact 24 has an average thickness less than 3 Å. In still further embodiments, the ohmic contact has an average thickness of about 1 Å. It will be understood by those skilled in the art that film thicknesses less than 10 Å, and in particular film thicknesses less than 5 Å, may represent partial or sub-monolayer coverage of the surface. Thus, even though the resulting layer is referred to as a "film", the film may only partially cover the surface of the p-type GaN layer.

Ohmic contacts according to some embodiments of the present invention may be formed by electron beam (e-beam) evaporation or any other suitable techniques for controllably forming atomically thin metallic films. For example, it may be possible form the ohmic contacts by electroplating provided adequate process control is maintained. In electron beam evaporation, a metal source target is heated in a vacuum chamber to the point of vaporization by a high intensity electron beam which melts a region of the target. An epitaxial wafer placed within the chamber is controllably coated with vaporized metal. E-beam evaporation and other film deposition methods are described in Chapter 6 of INTRODUCTION TO MICROELECTRONIC FABRICATION by R. Jaeger (2nd Ed. 2002).

The deposition rate of the process may be controlled by changing the current and energy of the electron beam. In some embodiments, the deposition rate is maintained at a low rate, e.g. in the range of 0.1-0.5 Å per second in order to maintain adequate control of film thickness. In addition, the film deposition may be controlled during deposition by monitoring the transmission properties of a witness slide on which the ohmic metal film is simultaneously deposited. The witness slide may be sapphire, quartz, or any other optically transmissive material on which a metal film may be deposited. The transmission sensitivity to the metal thickness is dependent upon the wavelength of the light used in the monitoring process. Namely, the transmission sensitivity is enhanced at shorter wavelengths. Accordingly, in some embodiments, the transmission properties of a sapphire witness slide are measured during or after film deposition by means of a monitoring system employing a UV source capable of emitting light at wavelengths of 350 nm or less, such as a UV spectrophotometer.

The ohmic contact layer 24 may have a thickness range of 1-10 Å. For platinum contacts, the preferred thickness is 1-5 Å. The slow deposition rate allows for reproducible and controllable deposition of the thin layer.

Once deposited, the ohmic contact layer 24 provides an ohmic or non-rectifying contact "as deposited." That is, no further processing or annealing may be required in order to provide a quasi-ideal electrical contact to the p-type GaN layer 32. However, in some cases it may be necessary or desirable to anneal the ohmic contact layer 24 or perform other post-deposition processing in order to improve its ohmic characteristics (such as to reduce the specific contact resistance of the contact layer, for example).

In some embodiments, deposition of the ohmic contact metal may be halted before the normalized transmissivity of the metal film on the witness slide falls below 98% at a measurement wavelength of 350 nm. In other embodiments, deposition of the ohmic contact metal may be halted before the normalized transmissivity of the metal film on the witness slide falls below 96% at a measurement wavelength of 350 nm. In further embodiments, deposition of the ohmic contact metal may be halted before the normalized transmissivity of the metal film on the witness slide falls below 92% at a measurement wavelength of 350 nm.

In some embodiments, the transmission properties of a sapphire witness slide are monitored during film deposition by means of a monitoring system employing a UV source capable of emitting light at wavelengths of 350 nm or less. By monitoring in situ the transmissivity of a metal film formed on a calibrated witness slide, the deposition process may be halted before or after the transmissivity of the metal film reaches a predetermined threshold level. Accordingly, the deposition of extremely thin metal films may be controlled with a high degree of precision according to embodiments of the invention.

Other methods of monitoring the thickness of the deposited metal film may be employed. For example, other physical, electrical or optical characteristics of the film (or the material on which the film is deposited) that vary according to film thickness may be measured and compared against known standards to determine film thickness. Such characteristics may include, but are not limited to, sheet resistivity, capacitance, or reflectance of the film. In one embodiment, the resonant frequency of a quartz crystal coated with the evaporating material during deposition is monitored. The resonant frequency of the crystal shifts in proportion to the thickness of the deposited film and may provide a sufficiently accurate measure of film thickness. See Chapter 6 of INTRODUCTION TO MICROELECTRONIC FABRICATION by R. Jaeger (2nd Ed. 2002).

In order to facilitate current spreading, a bond pad (not shown) may also be formed on the contact 24 and may include one or more current spreading fingers extending across portions of the ohmic contact. The bond pad formed on the ohmic contact 24 may include one or more current spreading fingers which extend from the bond pad 20 across portions of the ohmic contact 24. The current spreading fingers may be straight or curved. Other configurations are possible.

Furthermore, in embodiments of the present invention where the LED is designed to be flip-chip mounted (i.e. mounted substrate side up), the LED may further include a reflector. A metal stack, such as the metal stacks described in the U.S. Pat. No. 6,740,906, the disclosure of which is incorporated herein by reference in its entirety, may be formed on the reflector to provide barrier, adhesion and/or bonding layers, for example. The entire device may be mounted on a submount by means of solder.

After formation of the structure illustrated in FIG. 1 on a wafer, the individual LEDs may be singulated by sawing, for example, the wafer to score the wafer and breaking the wafer along the score lines to singulate the wafer. An etch of the processed substrate may be performed as described in U.S. patent application Ser. No. 10/811,350 entitled "Etching Of Substrates Of Light Emitting Devices" filed Mar. 26, 2004, the disclosure of which is incorporated herein by reference as if set forth herein.

Table 1 below provides radiant output characteristics for devices having a dominant output wavelength of 460 nm normalized by chip size and by contact size according to some embodiments of the present invention in comparison to corresponding 21 mW devices without a pit opening layer according to embodiments of the present invention.

TABLE 1

| | 460 nm devices | | |
|---|---|---|---|
| Radiant | Power Density ($\mu W/\mu m^2$) | | |
| Output (mW) | P-Contact size (220 um × 220 um) | Chip size (300 um × 300 um) | Chip size (290 um × 290 um) |
| 21 | 0.43 | 0.23 | 0.25 |
| 24 | 0.50 | 0.27 | 0.29 |
| 27 | 0.56 | 0.30 | 0.32 |
| 30 | 0.62 | 0.33 | 0.36 |

Table 2 below provides radiant output characteristics for devices having a dominant output wavelength of 460 nm normalized by chip size and by contact size according to some embodiments of the present invention

TABLE 2

| | 460 nm devices | |
|---|---|---|
| Radiant | Power Density ($\mu W/\mu m^2$) | |
| Output (mW) | P-Contact size (792 um × 792 um) | Chip size (900 um × 900 um) |
| 150 | 0.24 | 0.19 |
| 180 | 0.29 | 0.22 |
| 210 | 0.34 | 0.26 |

Table 3 below provides radiant output power characteristics for devices having a dominant output wavelength of 527 nm normalized by chip size and by contact size according to some embodiments of the present invention

TABLE 3

| | 527 nm devices | |
|---|---|---|
| Radiant | Power Density ($\mu W/\mu m^2$) | |
| Output (mW) | P-Contact size (220 um × 220 um) | Chip size (300 um × 300 um) |
| 9 | 0.19 | 0.1 |
| 12 | 0.25 | 0.13 |

While embodiments of the present invention have been described with reference to gallium nitride based devices, the teachings and benefits of the present invention may also be provided in other Group III nitrides. Thus, embodiments of the present invention provide Group III nitride based superlattice structures, quantum well structures and/or Group III nitride based light emitting diodes having superlattices and/or quantum wells.

Furthermore, embodiments of the present invention have been described with reference to 460 nm and 527 nm devices, however, other wavelength devices may be provided. For example, embodiments of the present invention may be particularly well suited for use in device having a dominant output wavelength of 430 nm or greater.

Additionally, while embodiments of the present invention have been described with reference to the active region extending into the pits, in some embodiments, the active region may end at the pit or only extend partially into the pits. In such embodiments, the light emitting device may include an active region, a contact layer on the active region and a pit opening region on which the active region and the contact layer are disposed. The pit opening region is configured to provide open pits by expanding a size of openings of a plurality of pits to a size sufficient for the contact layer to extend into the pits. The active region may not extend into the pits. The contact layer that extends into the pits may comprise p-type AlGaN or GaN.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a light emitting device, comprising:

controlling growth conditions of a layer of semiconductor material to provide low mobility of species on a growth surface of a layer on which active layers of the light emitting device are grown so as to open pits at threading dislocations in the layer of semiconductor material;

growing the active layers to extend into the pits in the layer of semiconductor material;

growing a hole injection layer on the active layers to extend into the pits; and growing a contact layer on the active layers to extend into the pits.

2. The method of claim 1, wherein the light emitting device comprises a Group III-V based light emitting device and wherein controlling growth conditions comprises controlling V/III ratio and/or growth temperature.

3. The method of claim 2, wherein the semiconductor layer comprises a Group III-nitride superlattice grown at a temperature of less than about 1000° C. in a nitrogen containing environment.

4. The method of claim 1, wherein growing the contact layer comprises growing the contact layer to close the pits.

5. The method of claim 1, wherein the layer of semiconductor material comprises a bulk GaN layer.

6. The method of claim 1, wherein the layer of semiconductor material comprises a bulk InGaN layer.

7. The method of claim 1, wherein the layer of semiconductor material is grown on a SiC substrate.

8. The method of claim 1, wherein the layer of semiconductor material is grown on a sapphire substrate.

9. A method of fabricating a light emitting device, comprising:

forming a pit opening layer so as to enhance the opening of pits associated with dislocations in the pit opening layer;

forming an active region on the pit opening layer, the active region comprising a plurality of layers that extend into the pits opened by the pit opening layer;

forming a hole injection layer on the active region, the hole injection layer extending into the pits; and forming a contact layer on the hole injection layer, the contact layer extending into the pits.

10. The method of claim 9, wherein the contact layer is formed to close the pits.

11. The method of claim 9, wherein forming an active region comprises forming an active region comprising a plurality of Group III-nitride quantum well layers that extend into the pits.

12. The method of claim 9, wherein forming an active region comprises forming an active region comprising a hole injection layer that extend into the pits.

13. The method of claim 9, wherein forming a pit opening layer comprises forming a Group III-nitride superlattice at a temperature of less than about 1000° C. in a nitrogen environment.

14. The method of claim 9, wherein forming a pit opening layer comprises forming a bulk GaN layer.

15. The method of claim 9, wherein forming a pit opening layer comprises forming a bulk InGaN layer.

16. The method of claim 9, wherein the light emitting device comprises a Group III-nitride based light emitting device.

17. The method of claim 9, wherein the pit opening layer is formed on a silicon carbide substrate.

18. The method of claim 9, wherein the pit opening layer is formed on a sapphire substrate.

19. The method of claim 9, wherein the light emitting device has a dominant output wavelength of about 527 nm.

20. The method of claim 19, wherein the light emitting device has a radiant output normalized to contact size of at least about 0.19 $\mu W/\mu m^2$.

21. The method of claim 19, wherein the light emitting device has a radiant output normalized to contact size of at least about 0.25 $\mu W/\mu m^2$.

22. The method of claim 9, wherein the light emitting device has a dominant output wavelength of about 460 nm.

23. The method of claim 22, wherein the light emitting device has a radiant output normalized to chip size of at least about 0.27 $\mu W/\mu m^2$.

24. The method of claim 6, wherein the light emitting device has a radiant output normalized to chip size of at least about 0.30 $\mu W/\mu m^2$.

25. The method of claim 6, wherein the light emitting device has a radiant output normalized to chip size of at least about 0.33 $\mu W/\mu m^2$.

26. The method of claim 6, wherein the light emitting device has a radiant output normalized to contact size of at least about 0.50 $\mu W/\mu m^2$.

27. The method of claim 6, wherein the light emitting device has a radiant output normalized to contact size of at least about 0.56 $\mu W/\mu m^2$.

28. The method of claim 6, wherein the light emitting device has a radiant output normalized to contact size of at least about 0.62 $\mu W/\mu m^2$.

29. The method of claim 6, wherein the light emitting device has a contact area of at least 600,000 $\mu m^2$ and a radiant output normalized to contact size of at least about 0.24 $\mu W/\mu m^2$.

* * * * *

UNITED STATES PATENT AND TRADEMARK OFFICE
CERTIFICATE OF CORRECTION

| | | |
|---|---|---|
| PATENT NO. | : 7,611,917 B2 | Page 1 of 1 |
| APPLICATION NO. | : 12/243507 | |
| DATED | : November 3, 2009 | |
| INVENTOR(S) | : Emerson et al. | |

It is certified that error appears in the above-identified patent and that said Letters Patent is hereby corrected as shown below:

Column 1, Line 54: Please correct "Group Iii" to read -- Group III --

Signed and Sealed this

Thirteenth Day of December, 2011

David J. Kappos
*Director of the United States Patent and Trademark Office*